United States Patent [19]
Crabill

[11] Patent Number: 4,841,253
[45] Date of Patent: Jun. 20, 1989

[54] MULTIPLE SPIRAL INDUCTORS FOR DC BIASING OF AN AMPLIFIER

[75] Inventor: Carl A. Crabill, Richardson, Tex.

[73] Assignee: Harris Corporation, Melbourne, Fla.

[21] Appl. No.: 38,377

[22] Filed: Apr. 15, 1987

[51] Int. Cl.[4] .............................................. H03F 3/60
[52] U.S. Cl. ...................................... 330/277; 330/54; 330/286
[58] Field of Search ........................... 330/54, 277, 286

[56] References Cited

U.S. PATENT DOCUMENTS

| 2,942,201 | 6/1960 | De Socio ............................... 330/54 |
| 4,342,967 | 8/1982 | Regan et al. .......................... 330/277 |

FOREIGN PATENT DOCUMENTS

| 2565047 | 11/1985 | France ................................. 330/277 |
| 0091216 | 7/1980 | Japan ................................... 330/277 |

OTHER PUBLICATIONS

Kessous et al., "Amplificateur VHF En Class E Utilisant un Transistor À Effect de Champ (FET) VMOS De Puissance", *MIEE AGEN* (Switzerland) No. 30, Oct. 1980, pp. 45–49.
Lee, "MOSFETs Rejuvenate Old Design for CATV Broadband Amplifiers", *Electronics*, vol. 44, No. 6, Mar. 15, 1971, pp. 72–75.
Master et al., "Silicon–On Sapphire Monolithic Microwave ICs", 1981, *IEEE International Solid-State Circuits Conf.*, Feb. 18, 1981, pp. 72–73.
Pengelly et al., "A Comparison Between Actively and Passively Matched S–Band GaAs Monolithic FET Amplifiers", 1981, *IEEE MTT-S International Microwave Digest*, Jun. 15–19, 1981, pp. 367–369.
1983 *IEEE MTT-S Digest*, pp. 70–73.

*Primary Examiner*—James B. Mullins
*Attorney, Agent, or Firm*—William A. Troner; Charles C. Krawczyk

[57] ABSTRACT

A monolithic semiconductor having an on-chip DC biasing including a plurality of series connected spiral inductors connected between the respective biasing and the semiconductor circuit. The spiral inductors provide a low resistive path for the DC biasing while also having a high inductance for isolating the RF signal from the bias sources, thereby improving the low frequency response. The capacitance associated with the individual spirals, however, is significantly less than the capacitance associated with a single spiral inductor having an equivalent inductance of the small series connected spirals; thus the higher frequency response is not degraded while the low frequency response has been improved.

6 Claims, 5 Drawing Sheets

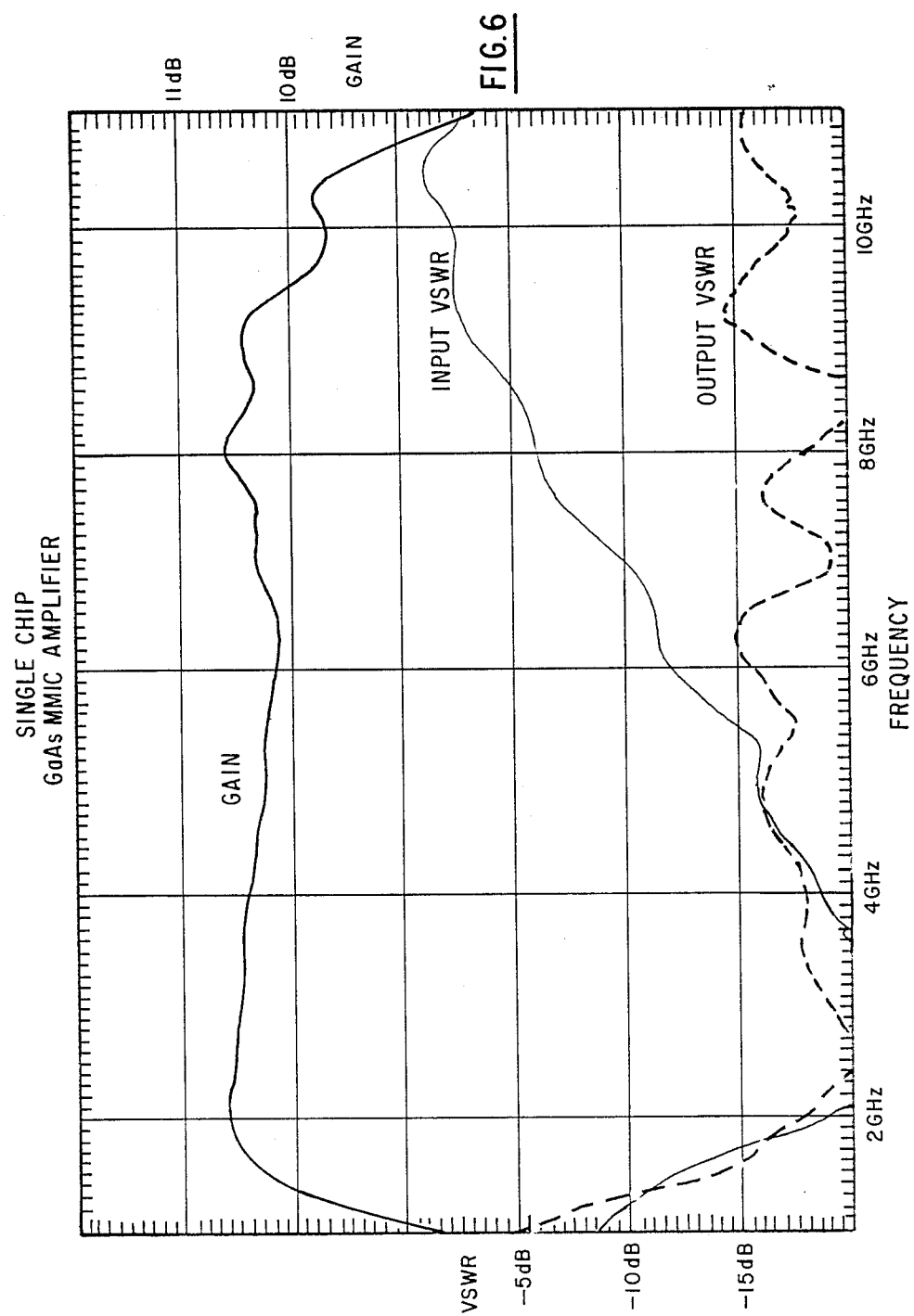

MULTIPLE SPIRAL INDUCTORS FOR DC BIASING OF AN AMPLIFIER

FIELD OF THE INVENTION

The present invention relates generally to amplifiers, and more particularly to an improved amplifier incorporating a plurality of series connected spiral inductors between the amplifier output and the DC biasing for effectively isolating the DC biasing from the amplifying circuit.

BACKGROUND OF THE INVENTION

A monolithic design allows for integration of the amplifier onto a single discrete chip which eliminates the need for extensive tuning and wire bonding. In a co-pending U.S. Application, Ser. No. 008519, filed Jan. 29, 1987 and entitled "Distributed Amplifier Having Improved D.C. Biasing and Voltage Standing Wave Ratio Performance", the performance of a distributed amplifier is improved by incorporating the DC biasing network on the integrated chip. A spiral inductor is arranged between the DC biasing networks and the amplifying devices for providing an effective open path for the frequency bandwidth desired for the amplifier, while providing a low resistive path for the DC bias currents. This results in isolating the frequency signal of the amplifier from the respective bias supplies, thereby improving the performance of the amplifier.

The effectiveness of this isolation, however, is dependent on the magnitude of the inductive impedance associated with the spiral inductor, which magnitude is directly related to the size of the spiral inductor. Additionally, for a given spiral inductor of certain size, the effective impedance of the spiral is directly related to the frequency of the RF signal, with the effective impedance of the spiral increasing with an increase in frequency of the RF signal. Thus, an inductor of a certain size arranged between a DC bias and the amplifying stage provides better isolation of the higher frequencies of the RF. To compensate for the lesser effective impedance of the lower frequencies of the RF signal such as in the range of 1.0 GHz to 3.0 GHz, the spiral inductor would have to be increased in size to provide a greater effective impedance. In this way, the overall inductance of the spiral will be increased due to the increased sizes, resulting in better isolation of the RF signal at the lower frequencies.

A limitation in increasing the inductor size for increasing the effective impedance at lower frequencies is that as the spiral inductor is increased in size, the shunt capacitance associated with the inductive line of the spiral and the ground back plane of the semiconductor device is also increased. This becomes potentially acute in GaAs semiconductor devices, where the substrate is typically very thin e.g., 5 mil. Thus, as the spiral inductor is structurally increased in size, the more parasitic shunt capacitance develops, thus resulting in a degradation of the higher frequency response. Therefore, although the performance of the lower frequency response is improved due to the increased inductance, the higher frequency response is adversely affected due to the increased shunt capacitance.

SUMMARY OF THE INVENTION

It is therefore, an object of the present invention to provide a new and improved biasing for a semiconductor circuit.

It is another object of the present invention to provide a new and improved semiconductor circuit having better isolation of the DC bias networks.

It is further an object of the present invention to provide a new and improved amplifing circuit having an improved lower frequency response without adversely affecting the higher frequency response.

In accordance with a preferred embodiment of the invention, a semiconductor circuit such as an amplifier is provided having the DC biasing circuits on the integrated circuit. Two or more series connected spiral inductors are provided between the respective DC biasing networks and the amplifying stages for providing the isolation of the RF signal from the respective DC biasing networks. Although each of the individual spirals have a shunt capacitance associated therewith, the total sum of these capacitances is significantly less than the shunt capacitance associated with a single spiral inductor having the same inductance as the cumulative inductance provided by the several smaller spiral inductors.

Thus, the present invention resolves the problem of increasing the inductance of the DC bias path without significantly increasing the shunt capacitance, resulting in improved lower frequency response of the amplifier without adversely affecting the higher frequency response. These and other objects, advantages, and novel features of the present invention will be apparent from the following detailed description of the invention when considered in conjunction with the accompanying drawings.

BRIEF DESCRIPTION OF THE DRAWINGS

FIG. 6 is a graph of the gain and VSWR performance of the amplifier circuit of FIG. 2.

DETAILED DESCRIPTION OF THE DRAWINGS

Figure 1:
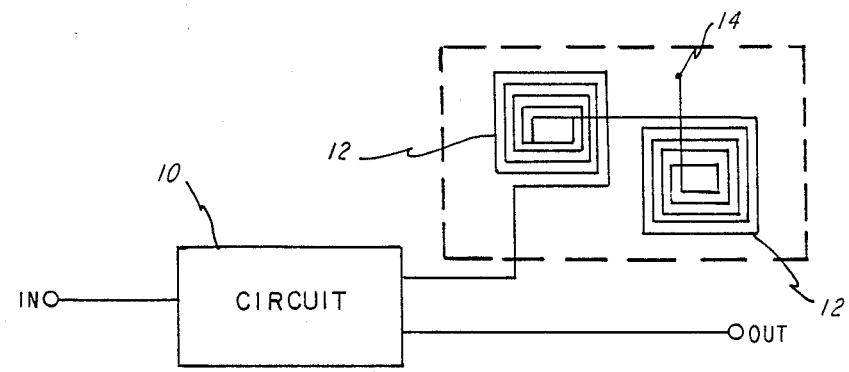
FIG. 1 is a schematic of a preferred generic embodiment of a circuit according to the present invention.

FIG. 1 illustrates the use of the invention with any semiconductor circuit 10. In the preferred embodiment, the invention is shown as having two spiral inductors 12 connected in series between a bias voltage 14 and the circuit 10.

Figure 2:
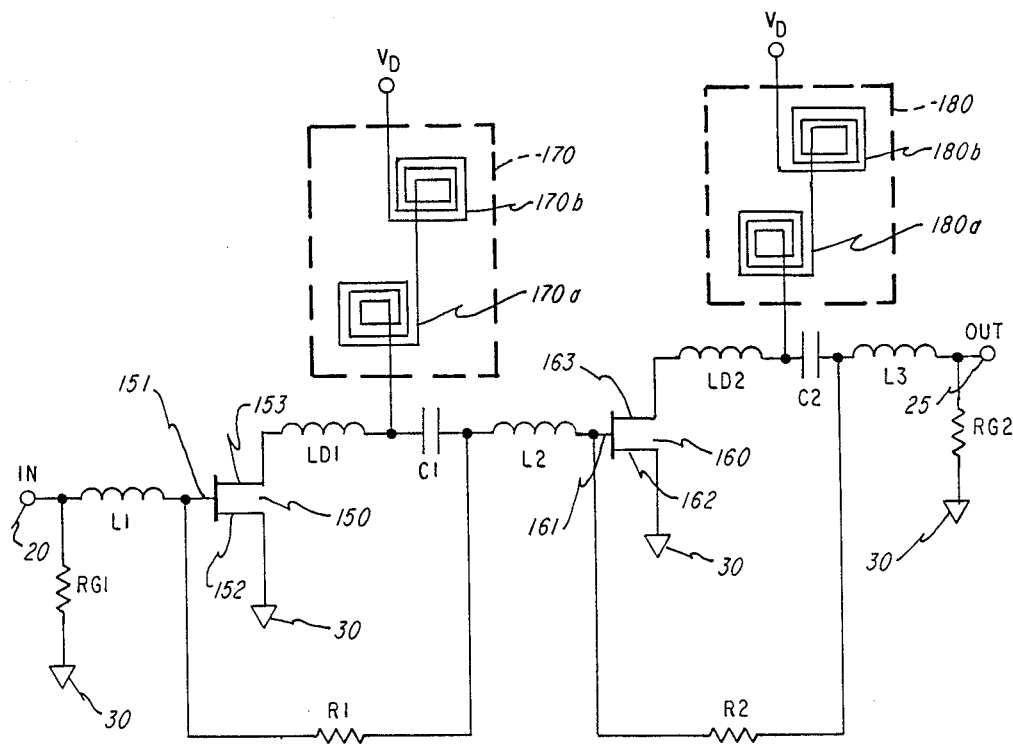
FIG. 2 is a schematic of a preferred embodiment of an amplifier circuit according to the present invention.
Figure 3:
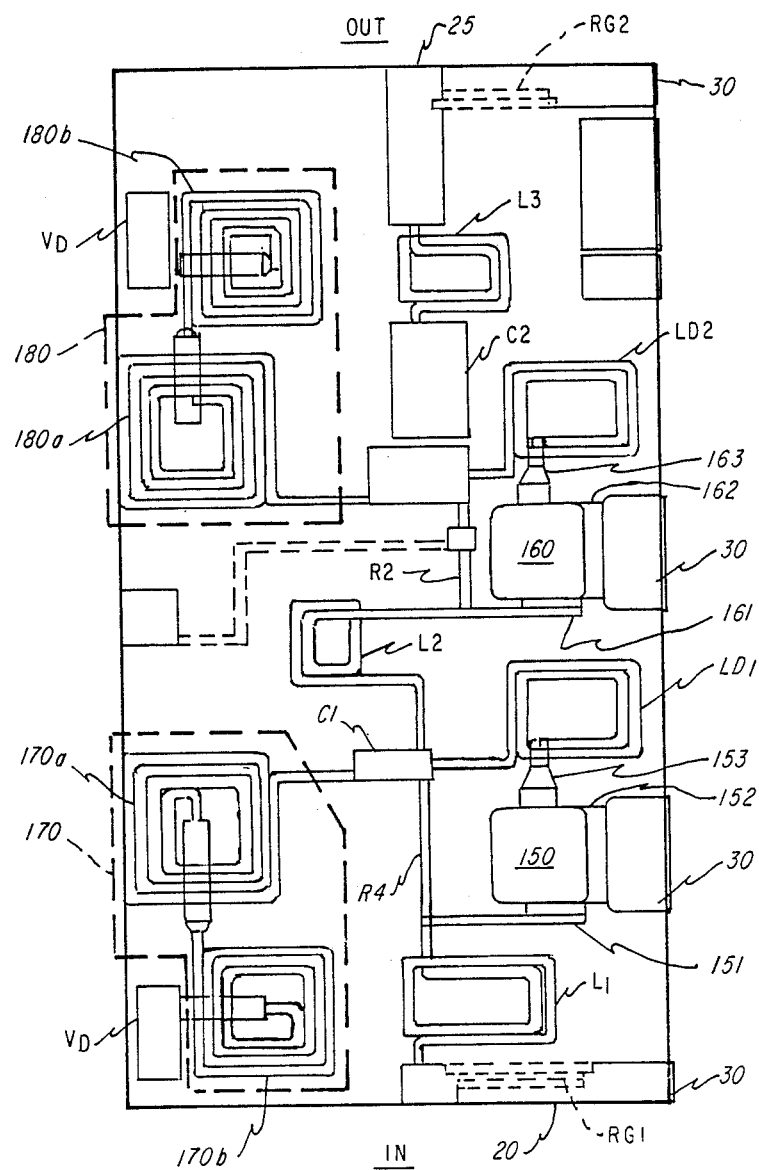
FIG. 3 is a top view of a mask layout representing the amplifier circuit of FIG. 2.

Referring to FIGS. 2 and 3, an embodiment of the invention is shown including an amplifying circuit. The amplifying circuit includes by way of example, two amplifying MESFETs 150 and 160. The MESFETs are connected such that the drain output 153 of the first MESFET 150 is connected to the gate input 161 of the second MESFET 160. Tuning inductors $L_{D1}$ aand $L_2$ are coupled therebetween for purposes of tuning the circuit for optimum performance. Additionally, a DC blocking capacitor $C_1$ is connected between the drain output and a feedback resistor $R_1$, for separating the respective gate and drain voltages.

The gate 151 of the first MESFET 150 is connected to the input 20 via a tuning inductive line $L_1$ as well as being RF connected, but DC isolated to the drain 153 via feedback resistor $R_1$. A gate bias resistor $R_{G1}$ is connected between the gate 151 and ground potential 30 for providing a ground bias to the gate. The value of $R_{G1}$ is approximately 1200 ohms for the embodiment shown, which is sufficient to provide a high impedance for inhibiting the input RF signal from shunting to ground. Because the gate bias current is negligible compared to the drain bias current, DC losses in the gate bias current is minimal. Therefore, the implementation of the spiral inductors in providing a low resistive path for the DC bias current is not necessary for the gate biasing.

The drain DC bias $V_D$ is connected to the drain 153 of the first MESFET 150 via the double spiral inductor pair 170, wherein the double spiral inductor provides a minimal resistive path for the drain current while providing a sufficient inductance for isolating the RF signal from the bias source. An RF shunt capacitor not shown may be connected off-chip between the bias supply $V_D$ and ground for shunting either leakage RF signal originating through the spiral pair 170 from the input or RF signal originating from the DC bias supplies.

The drain 163 of the second MESFET 160 is connected to gate 161 via a tuning inductor $L_{D2}$, a first side of a DC blocking capacitor $C_2$ and a feedback resistor $R_2$. Connected to a second side of the capacitor $C_2$ is the output 25 via a tuning inductor $L_3$. Resistor $R_{G2}$ is connected between the output 25 and ground 30 to provide the gate biasing for the gate 161 of the second MESFET 160.

The drain DC biasing $V_D$ is provided to the drain 163 of the second MESFET 160 via a second spiral inductor pair 180.

As noted above, the spiral inductor pairs 170 and 180, provide a minimal resistive path for the DC bias current; the inductor pairs having only approximately 5 ohms. Also, the inductance of the cumulative spirals can be designed to be sufficient enough even in GaAs semiconductors such that the DC biases are isolated even at the lower frequency band such as 1.5 to 3.0 GHz, without the shunt capacitance of the spirals being large enough to degrade the higher frequency performance.

Figure 5:
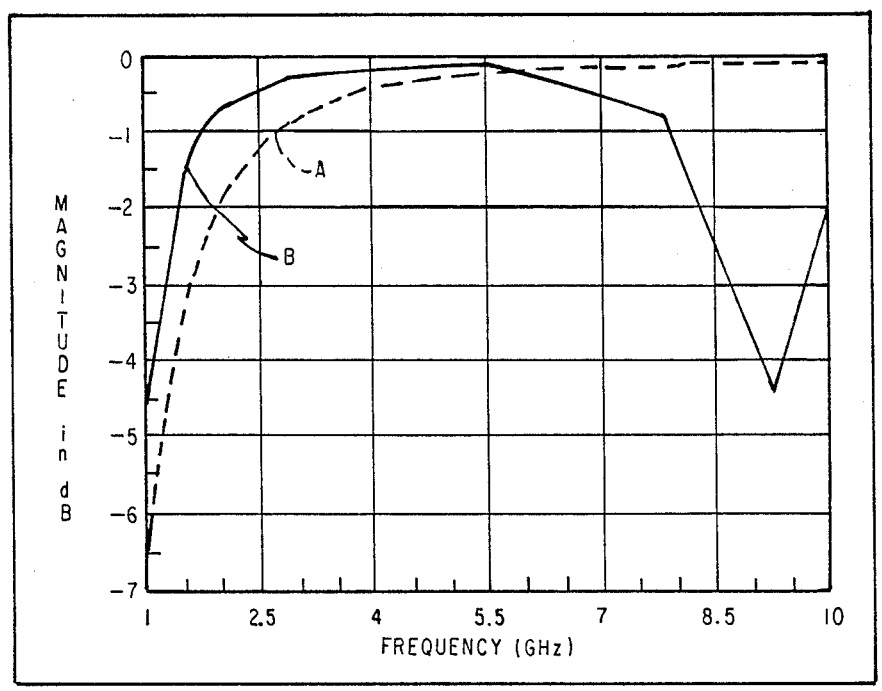
FIG. 5 is a graph illustrating the differences in gain as it relates to the frequency of the RF for both the single bias spiral (A) of certain inductance and a double bias spiral (B) of an equivalent inductance.

It should be noted that the specific sizes of the individual spirals as well as the number of spirals needed for each drain can be changed to accomodate the frequency band desired as well as the type of amplifier design (e.g. cascaded or distributed) utilized. It has been determined experimentally by the inventor that, for optimal performance with using two spirals in a cascaded pair of amplifiers as that shown in FIGS. 2 and 3, the first spiral 170a, 180a of each pair is made larger, e.g., approximately 3.4 nH, than the second spiral 170b, 180b, which is approximately 2.2 nH. These values provide for a relatively flat gain response for a frequency band as low as 1.5 GHz, for which an extremely flat response was not possible in GaAs semiconductors without the double spiral inductors as shown in FIGS. 5 and 6.

Figure 4:
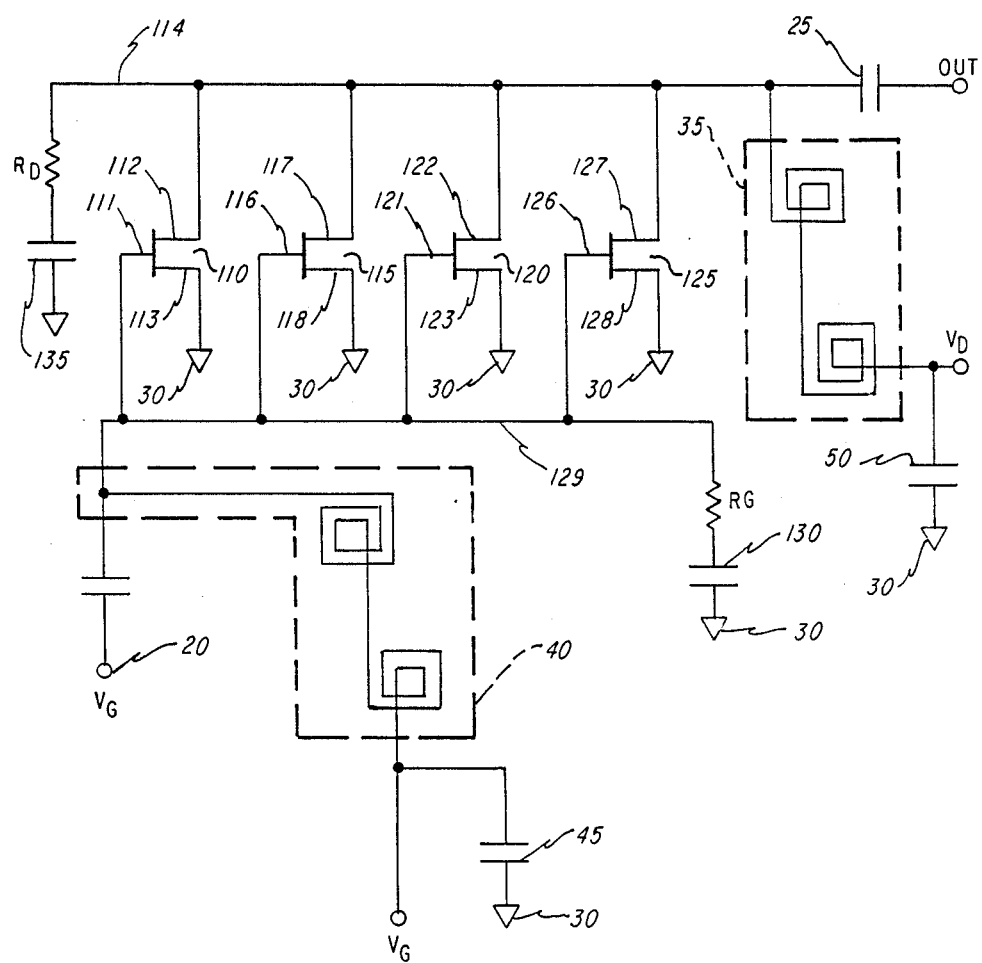
FIG. 4 is a schematic of another preferred embodiment of a distributed amplifier circuit according to the present invention.

FIG. 4 shows a distributed or "traveling wave" amplifier incorporating four FET stages connected in parallel. Theoretical formulas defining the performance of an amplifier provide that optimal performance occurs for the 6–18 GHz frequency band when four amplifying FET's 110, 115, 120, 125 are used. However, using the double spiral inductor pairs 35 and 40 as shown could provide a more flat gain response for frequencies lower than 6 GHz, because of the improved isolation of the DC bias networks.

The gates 111, 116 121, 126 of the four FETS 110, 115, 120, 125, are all connected to the amplifier input 20. A gate terminating resistor RG is arranged between the fourth FET 125 via an inductive connecting line 129 and a ground potential 30 via a bypass capacitor 130. This resistor provides termination for any traveling wave not propagated through the amplifying FET device, thereby avoiding degradation of the input RF signal due to interferring wave reflections.

With respect to the amplifier output, the drains 112, 117, 122, 127 of the four FET's are all connected to the output 25. The drain terminating resistor RD is arranged between the first FET 110 via an inductive connecting line 114 and ground potential 30 via a bypassing capacitor 135. Similar to the gate terminating resistor RG, the drain terminating resistor provides a termination of any traveling wave reflected from the output of the amplifier.

FIG. 5 shows a computer simulation illustrating the differences in the frequency response of an amplifier having only one single large bias spiral (A) and an amplifier having a double bias spiral pair (B) of an equivalent inductance as the large bias spiral. This graph shows how the flatness in the frequency range of 1.5 GHz to 4.0 GHz is significantly improved by using the double bias spiral in place of a single large spiral. By using the invention, it can be seen that the loss in gain at the low frequency of 1.5 GHz is improved by at least 2 dB. This graph thus illustrates the significant improvement the invention provides. A single spiral of a size sufficient not to degrade the high frequency response does not provide enough inductance to prevent gain loss below 3.0 GHz. The difference in gain between 1.5 GHz and 4.0 GHz for the single bias spiral is approximately 3.2 dB, whereas by comparison, the difference in gain for the same frequency range for the double bias spiral pairs is only approximately 0.3 dB, the latter improvement being effected without degrading the higher frequency response.

FIG. 6 shows the extremely flat gain achieved from the circuit of FIG. 3 which implements the double spiral in a GaAs circuit. As indicated above, the gain flatness is less than ±3 dB for the 1.5 GHz to 9.3 GHz band. FIG. 6 additionally shows the VSWR performance attributed to the use of the double spiral. The double spiral creates such a high impedance to ground that no tuning at low frequency is needed to compensate for VSWR effects that would be present with the single spiral. Thus the VSWR is −15 dB from 1.5 GHz to 6.0 GHz. The extreme flatness from 2.0 GHz to 8.0 GHz is due to the multiple inductors. The rolloff at 1.5 GHz is only 0.3 dB below that at 2.0 GHz with the difference in gain between 1.5 GHz and 4 GHz being 0.15 dB.

For purposes of this application, RF is defined as any electromagnetic wave frequencies including but not limited to those frequencies in the microwave region.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. An amplifying means having an input circuit adapted for receiving electromagnetic wave signals and an output circuit, said amplifying means comprising:

a plurality of amplifying stages cascadingly connected between said input circuit and output circuit of said amplifying means wherein said plurality of amplifying stages provides a signal path between said input circuit and output circuit, wherein each of said amplifying stages includes an input portion and an output portion; and inductive means connected outside said signal path and between each output portion of said amplifying stages and a DC bias, said inductive means including at least two spiral inductors connected in series, wherein each of said spiral inductors includes a predetermined inductance for providing a cumulative impedance between the respective output portions of said amplifying stages and said DC bias for isolating said electromagnetic wave signals from said DC bias in a frequency band of 1.5 GHz and 3.0 GHz.

2. The amplifying means of claim 1, wherein said amplifying stages include metal semiconductor field effect transistors.

3. The amplifying means of claim 1, wherein said spiral inductors further include a cumulative capacitance, wherein said cumulative capacitance is less than a capacitance associated with a single spiral inductor having a substantially same inductance as said spiral inductors of said inductive means.

4. An amplifying means having an input circuit adapted for receiving electromagnetic wave signals and an output circuit, said amplifying means comprising:

a plurality of amplifying stages connected in parallel between said input circuit and output circuit of said amplifying means wherein said plurality of amplifying stages is connected in such a manner as to provide a signal path from the input circuit to the output circuit, and a first inductive means connected outside said signal path and between a first DC bias source and said output circuit of said amplifying means, wherein said inductance means includes at least two spiral inductors connected in series, wherein each of said spiral inductors includes a predetermined inductance for providing a cumulative impedance between the output circuit of said amplifying means and said first DC bias source for isolating said electromagnetic wave signals from said DC bias source and wherein said first inductive means provides DC bias to said plurality of amplifying stages.

5. The amplifying means of claim 4, wherein each of said amplifying stages include a metal semiconductor field effect transistor, each transistor having its gate connected to said input of said amplifying means, its drain connected to said output circuit of said amplifying means, and its source connected to a first voltage potential.

6. The amplifying means of claim 5, further including a second inductive means connected between a second DC bias source and said input circuit of said amplifying means, wherein said inductive means includes at least two spiral inductors connected in series, wherein each of said spiral inductors includes a predetermined inductance for providing a cumulative impedance between said input circuit and said second DC bias source for isolating said electromagnetic wave signals from said second DC bias source.

* * * * *